(12) United States Patent
Shao et al.

(10) Patent No.: US 12,456,645 B2
(45) Date of Patent: Oct. 28, 2025

(54) SEMICONDUCTOR STRUCTURE WITH SILICON-GERMANIUM COMPOUND AND MANUFACTURING METHOD THEREOF

(71) Applicants: CHANGXIN MEMORY TECHNOLOGIES, INC., Hefei (CN); BEIJING SUPERSTRING ACADEMY OF MEMORY TECHNOLOGY, Beijing (CN)

(72) Inventors: Guangsu Shao, Hefei (CN); Pan Yuan, Hefei (CN); Minmin Wu, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 740 days.

(21) Appl. No.: 17/664,242

(22) Filed: May 20, 2022

(65) Prior Publication Data
US 2023/0066811 A1    Mar. 2, 2023

Related U.S. Application Data

(63) Continuation of application No. PCT/CN2022/077803, filed on Feb. 25, 2022.

(30) Foreign Application Priority Data

Aug. 30, 2021 (CN) .......................... 202111006058.3

(51) Int. Cl.
H01L 21/762 (2006.01)
H01L 21/304 (2006.01)

(52) U.S. Cl.
CPC .... *H01L 21/76224* (2013.01); *H01L 21/3043* (2013.01)

(58) Field of Classification Search
CPC .... H10D 86/016; H10D 30/63; H10D 84/016; H10D 84/0195; H10B 63/34; H10B 12/05–056
See application file for complete search history.

(56) References Cited

U.S. PATENT DOCUMENTS 9,570,612 B2   2/2017   Ohtou et al.
9,583,629 B2   2/2017   Nishimura et al.
(Continued)

FOREIGN PATENT DOCUMENTS

CN   104900651 A   9/2015
CN   105206670 A   12/2015
(Continued)

OTHER PUBLICATIONS

International Search Report cited in PCT/CN2022/077721 mailed Apr. 28, 2022, 9 pages.
(Continued)

*Primary Examiner* — Steven B Gauthier
*Assistant Examiner* — Candice Chan
(74) *Attorney, Agent, or Firm* — Kilpatrick Townsend & Stockton LLP

(57) ABSTRACT

The present application provides a semiconductor structure and a manufacturing method thereof, relates to the technical field of semiconductors. The manufacturing method includes: providing a substrate, the substrate including a first semiconductor material layer, a silicon-germanium compound layer and a second semiconductor material layer that are stacked sequentially; forming, in the substrate, first trenches extending along a first direction and second trenches extending along a second direction, and the first trenches and the second trenches separating the substrate into a plurality of spaced pillar structures; doping the pillar structures, such that the silicon-germanium compound layer
(Continued)

forms a channel region; and forming a dielectric layer on an outer peripheral surface of each of the pillar structures, and a gate on an outer peripheral surface of the dielectric layer, the gate being opposite to at least a part of the channel region.

10 Claims, 18 Drawing Sheets

(56) References Cited

U.S. PATENT DOCUMENTS

| | | | |
|---|---|---|---|
| 10,629,538 | B2 | 4/2020 | Zhang |
| 10,714,398 | B2 | 7/2020 | Zhu |
| 2009/0148991 | A1 | 6/2009 | Chung et al. |
| 2012/0052640 | A1 | 3/2012 | Fischer et al. |
| 2015/0255510 | A1* | 9/2015 | Nishimura ........... H10D 64/516 |
| | | | 257/329 |
| 2015/0349059 | A1 | 12/2015 | Vellianitis |
| 2018/0097065 | A1* | 4/2018 | Zhu ..................... H10D 30/025 |

FOREIGN PATENT DOCUMENTS

| | | |
|---|---|---|
| CN | 106298778 A | 1/2017 |
| CN | 106449596 A | 2/2017 |
| CN | 109841675 A | 6/2019 |
| CN | 111211170 A | 5/2020 |

OTHER PUBLICATIONS

International Search Report cited in PCT/CN2022/077803 mailed Apr. 28, 2022, 9 pages.

* cited by examiner

SEMICONDUCTOR STRUCTURE WITH SILICON-GERMANIUM COMPOUND AND MANUFACTURING METHOD THEREOF

CROSS-REFERENCE TO RELATED APPLICATIONS

The present application is a continuation application of International Patent Application No. PCT/CN2022/077803, filed on Feb. 25, 2022, which claims the priority to Chinese Patent Application No. 202111006058.3, titled "SEMICONDUCTOR STRUCTURE AND MANUFACTURING METHOD THEREOF" and filed with China National Intellectual Property Administration (CNIPA) on Aug. 30, 2021. The entire contents of International Patent Application No. PCT/CN2022/077803 and Chinese Patent Application No. 202111006058.3 are incorporated herein by reference.

TECHNICAL FIELD

The present application relates to the field of semiconductors, and in particular to a semiconductor structure and a manufacturing method thereof.

BACKGROUND

With the development of semiconductor technologies, there are increasingly higher requirements on an integration level of the semiconductor structure. A higher integration level of the semiconductor structure can be achieved by improving the semiconductor structure. For example, a dynamic random access memory (DRAM) usually includes a plurality of memory cells. Each memory cell includes a transistor and a capacitor. The capacitor stores data information, while the transistor reads/writes the data information in the capacitor. By improving topological structures of the memory cells, such as using 4F2 memory cells, the memory cells can take up less area to improve the storage density of the memory. Moreover, a higher integration level of the semiconductor structure can further be achieved by decreasing the feature size of the semiconductor structure. However, with the smaller feature size of the semiconductor structure, the transistor is prone to generating the short-channel effect to cause poor performance of the semiconductor structure.

SUMMARY

According to a first aspect, an embodiment of the present application provides a manufacturing method of a semiconductor structure, including: providing a substrate, the substrate including a first semiconductor material layer, a silicon-germanium compound layer and a second semiconductor material layer that are stacked sequentially; forming, in the substrate, first trenches extending along a first direction and second trenches extending along a second direction, the first trenches and the second trenches separating the substrate into a plurality of spaced pillar structures, and the pillar structures each including the second semiconductor material layer, the silicon-germanium compound layer and a part of the first semiconductor material layer; doping the pillar structures, such that one of the first semiconductor material layer and the second semiconductor material layer forms a source region and the other of the first semiconductor material layer and the second semiconductor material layer forms a drain region, and the silicon-germanium compound layer forms a channel region; and forming a dielectric layer on an outer peripheral surface of each of the pillar structures, and a gate on an outer peripheral surface of the dielectric layer, the gate being opposite to at least a part of the channel region.

According to a second aspect, an embodiment of the present application provides a manufacturing method of a semiconductor structure, including: providing a substrate, the substrate including a first semiconductor material layer, a silicon-germanium compound layer and a second semiconductor material layer that are stacked sequentially; forming, in the substrate, first trenches extending along a first direction, the first trenches penetrating through the second semiconductor material layer and the silicon-germanium compound layer, and extending to the first semiconductor material layer; performing doping, such that one of the first semiconductor material layer and the second semiconductor material layer between two adjacent ones of the first trenches forms a source region and the other of the first semiconductor material layer and the second semiconductor material layer between two adjacent ones of the first trenches forms a drain region, and the silicon-germanium compound layer forms a channel region; forming, in the substrate, second trenches extending along a second direction, the second trenches penetrating through the second semiconductor material layer and the silicon-germanium compound layer, and extending to the first semiconductor material layer, and the first trenches and the second trenches separating the substrate into a plurality of spaced pillar structures; and forming a dielectric layer on an outer peripheral surface of each of the pillar structures, and a gate on an outer peripheral surface of the dielectric layer, the gate being opposite to at least a part of the channel region.

According to a third aspect, an embodiment of the present application provides a semiconductor structure, including a substrate, where a plurality of spaced pillar structures are formed in the substrate, the pillar structures each include a source region, a channel region and a drain region that are stacked sequentially, a material of the channel region includes a silicon-germanium compound, a dielectric layer is circumferentially provided on an outer peripheral surface of each of the pillar structures, a gate is circumferentially provided on an outer peripheral surface of the dielectric layer, and the gate is opposite to at least a part of the channel region.

DETAILED DESCRIPTION

In order to improve performance of the semiconductor structure, an embodiment of the present application provides a manufacturing method of a semiconductor structure. By forming the VGAA transistor, and forming the channel region with the silicon-germanium compound layer, not only can the short-channel effect of the transistor be improved, but also a higher electron mobility in the channel region can be achieved, the saturation voltage of the VGAA transistor can be reduced, and better performance of the semiconductor structure can be yielded.

In order to make the objectives, features and advantages of the embodiments of the present application clearer, the technical solutions in the embodiments of the present application are described clearly and completely below with reference to the drawings in the embodiments of the present application. Apparently, the described embodiments are some rather than all of the embodiments of the present application. All other embodiments obtained by those of ordinary skill in the art based on the embodiments of present application without creative efforts should fall within the protection scope of the present application.

Figure 1:
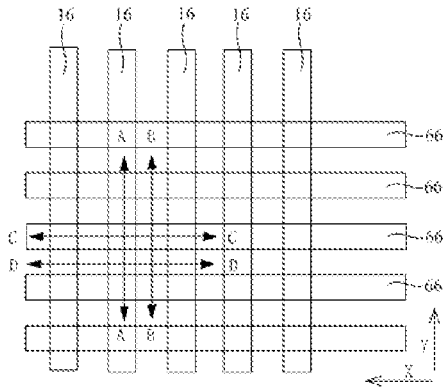
FIG. 1 is a top view of a semiconductor structure according to an embodiment of the present application.

FIG. 1 is a top view of a semiconductor structure according to an embodiment of the present application. Referring to FIG. 1, word lines (WLs) 66 and BLs 16 are formed in the semiconductor structure. The BLs 16 extend along a first direction, while the WLs 66 extend along a second direction. There is an included angle between the first direction and the second direction. For example, the first direction may be perpendicular to the second direction. Specifically, as shown in FIG. 1, the BLs 16 extend along a vertical direction (Y direction), while the WLs 66 extend along a horizontal direction (X direction). The WLs 66 or the BLs 16 may be straight lines, and may also be fold lines.

FIG. 1 shows four different positions at A, B, C and D. Specifically, the section A-A is parallel to the extension direction of the BLs 16 and located on the BLs 16, and the section B-B is parallel to the extension direction of the BLs 16 and located between adjacent BLs 16. The section C-C is parallel to the extension direction of the WLs 66 and located on the WLs 66, and the section D-D is parallel to the extension direction of the WLs 66 and located between adjacent WLs 66.

Figure 2:
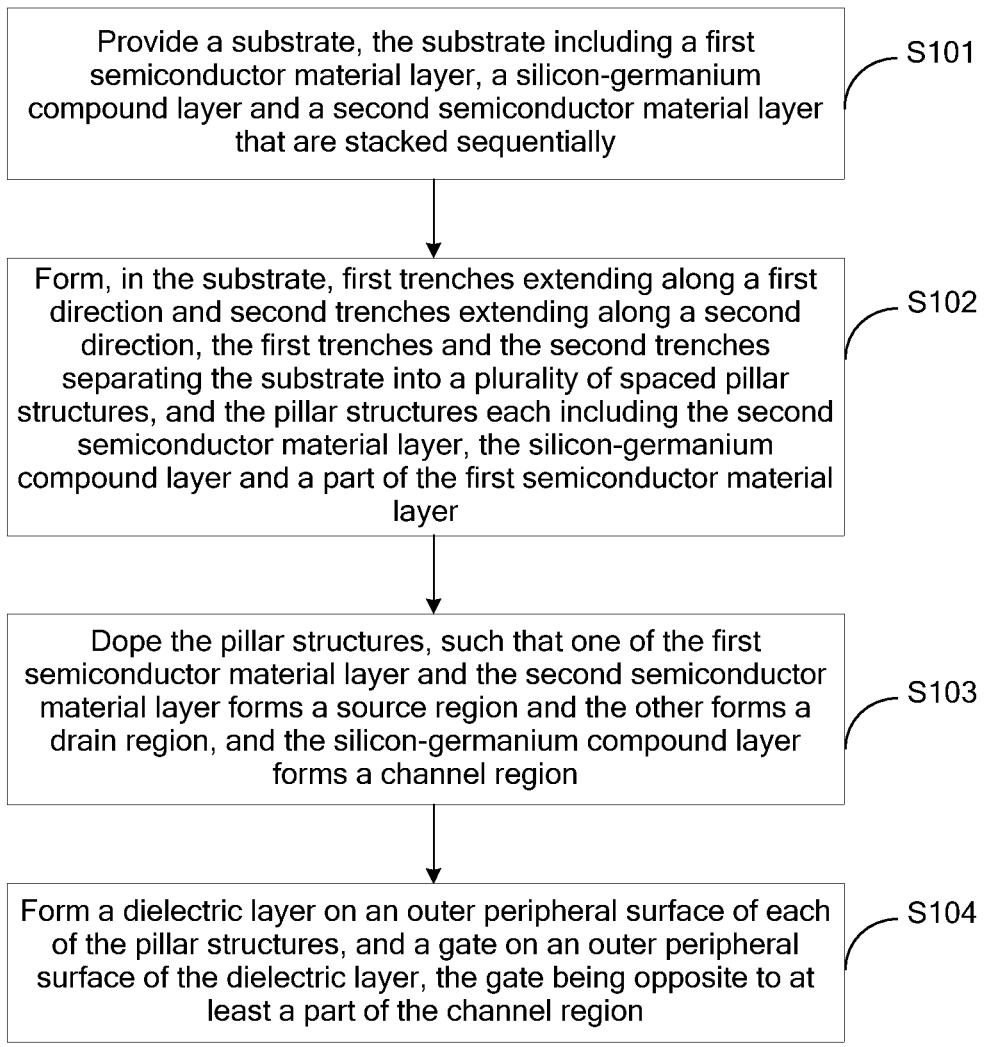
FIG. 2 is a flowchart of a manufacturing method of a semiconductor structure according to an embodiment of the present application.

Referring to FIG. 2, an embodiment of the present application provides a manufacturing method of a semiconductor structure, including the following steps:

Step S101: Provide a substrate, the substrate including a first semiconductor material layer, a silicon-germanium compound layer and a second semiconductor material layer that are stacked sequentially.

Figure 3:
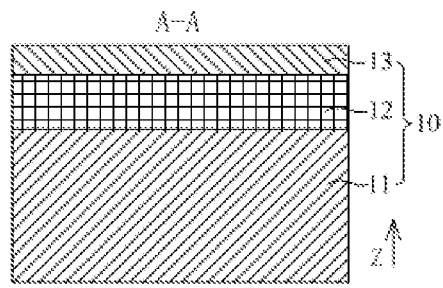
FIG. 3 to FIG. 6 are schematic sectional views of a substrate at A-A, B-B, C-C and D-D according to an embodiment of the present application.
Figure 4:
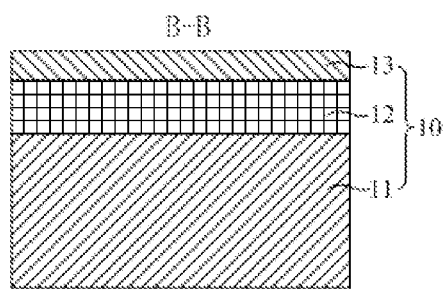
Figure 5:
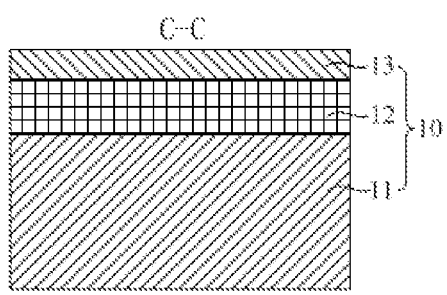
Figure 6:
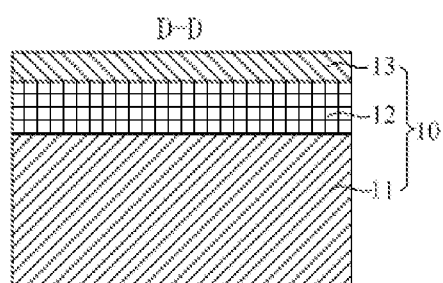
Figure 7:
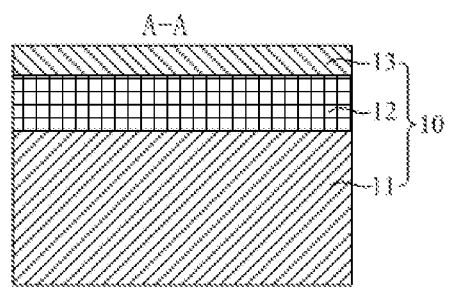
FIG. 7 to FIG. 10 are schematic sectional views at A-A, B-B, C-C and D-D after first trenches are formed according to an embodiment of the present application.
Figure 8:
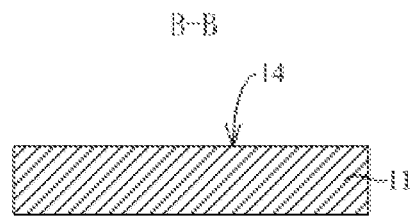
Figure 9:
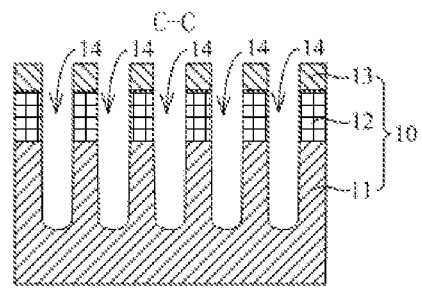
Figure 10:
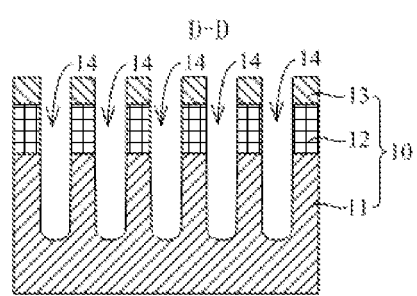
Figure 11:
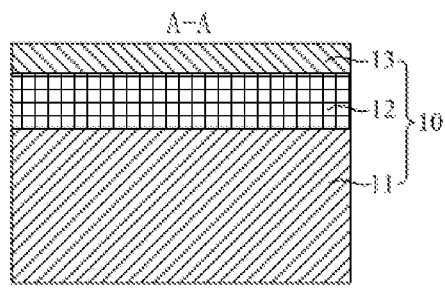
FIG. 11 to FIG. 14 are schematic sectional views at A-A, B-B, C-C and D-D after a sacrificial layer is formed according to an embodiment of the present application.
Figure 12:
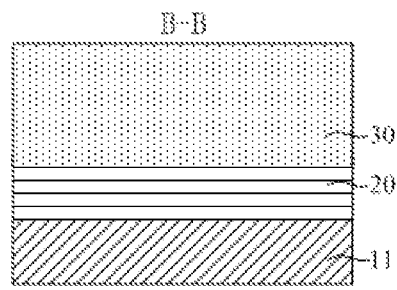
Figure 13:
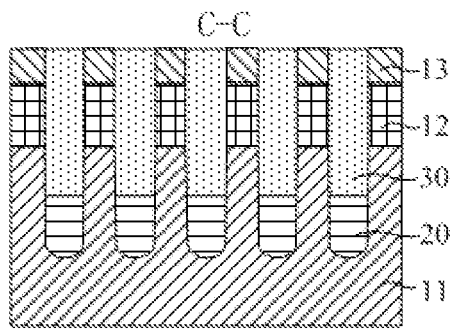
Figure 14:
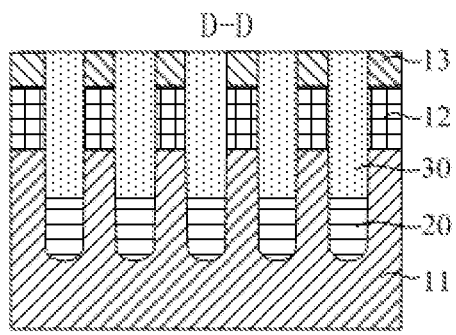
Figure 15:
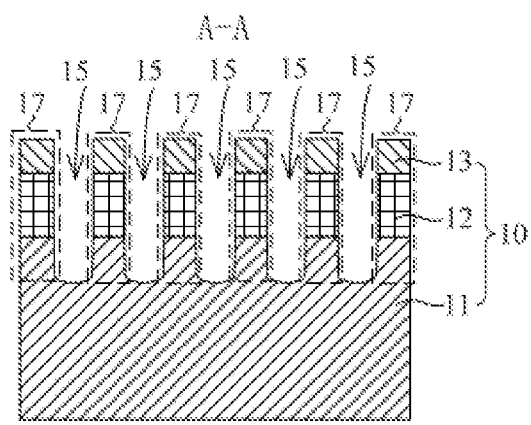
FIG. 15 to FIG. 18 are schematic sectional views at A-A, B-B, C-C and D-D after second trenches are formed according to an embodiment of the present application.
Figure 16:
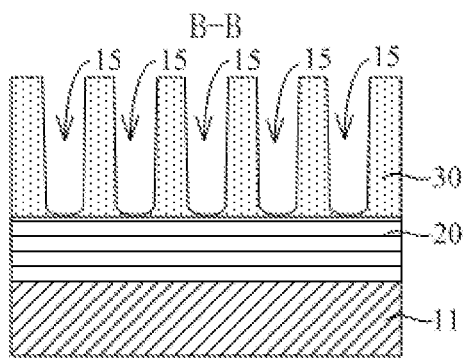
Figure 17:
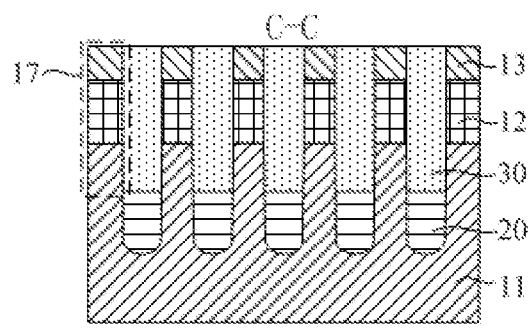
Figure 18:
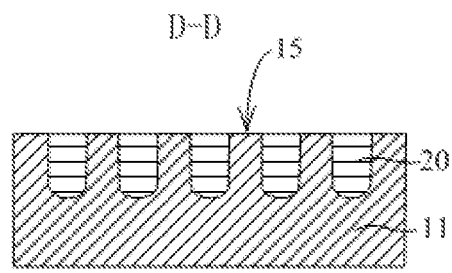
Figure 19:
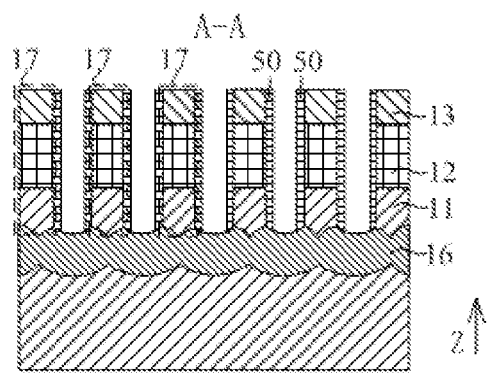
FIG. 19 to FIG. 22 are schematic sectional views at A-A, B-B, C-C and D-D after dielectric layers are formed according to an embodiment of the present application.
Figure 20:
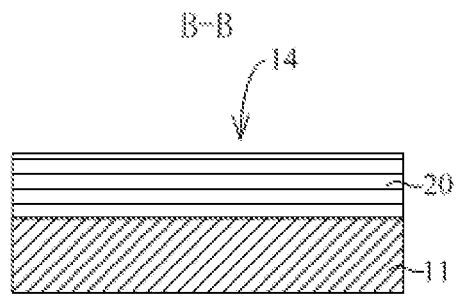
Figure 21:
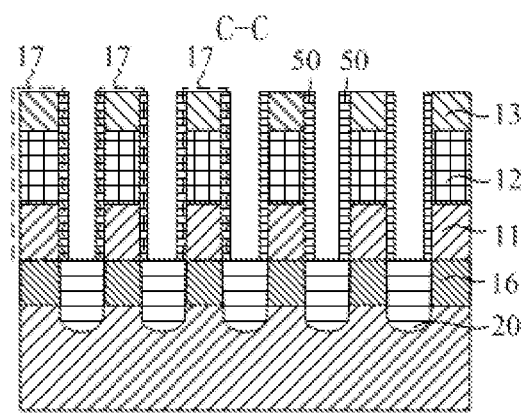
Figure 22:
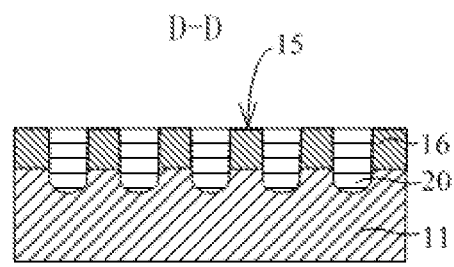
Figure 23:
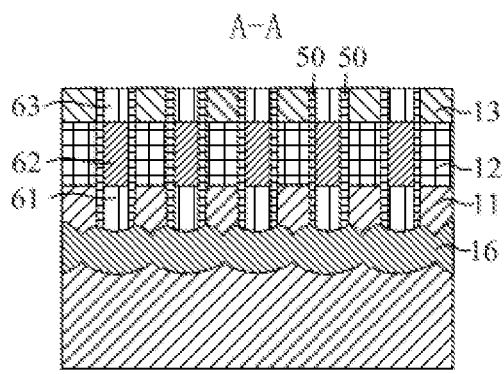
FIG. 23 to FIG. 26 are schematic sectional views at A-A, B-B, C-C and D-D after a third insulating layer is formed according to an embodiment of the present application.
Figure 24:
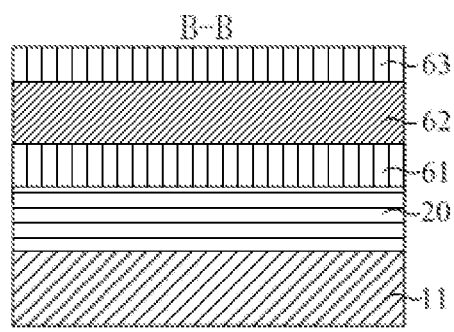
Figure 25:
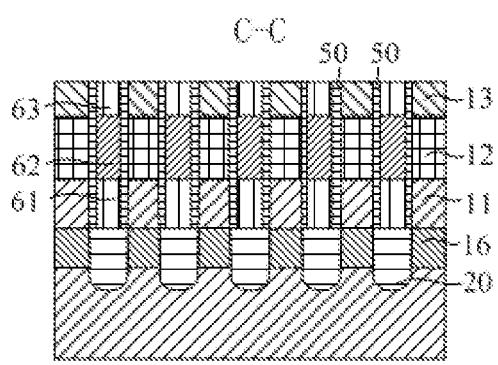
Figure 26:
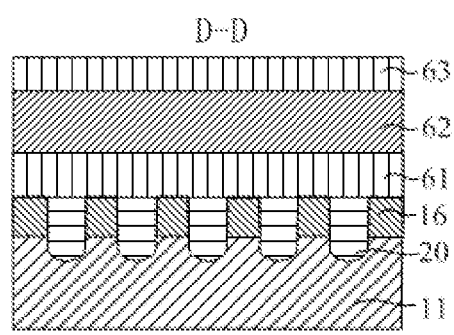

Referring to FIG. 3 to FIG. 6, a substrate 10 includes a first semiconductor material layer 11, a silicon-germanium compound layer 12 and a second semiconductor material layer 13 that are arranged sequentially in the vertical direction (Z direction shown in FIG. 3). As shown in FIG. 3 to FIG. 6, the silicon-germanium compound layer 12 is provided on the first semiconductor material layer 11. The second semiconductor material layer 13 is provided on the silicon-germanium compound layer 12.

The first semiconductor material layer 11 and the second semiconductor material layer 13 may be made of a same material. The semiconductor material may be silicon, germanium, silicon on insulator (SOI) or a germanium on insulator (GOI).

The silicon-germanium compound layer 12 may be made of a different material from the first semiconductor material layer 11 and the second semiconductor material layer 13. The silicon-germanium compound may be silicon germanide, or a mixture containing the silicon germanide. For example, the first semiconductor material layer 11 and the second semiconductor material layer 13 are made of silicon, while the silicon-germanium compound layer 12 is made of silicon germanide. In this case, the silicon-germanium compound layer 12 may be formed on the first semiconductor material layer 11 by epitaxial growth. The silicon germanide and the silicon are combined coherently, such that current carriers have a higher mobility in quantum wells (QWs) formed by the silicon germanide and the silicon. The current carriers refer to substances capable of moving freely and carrying electric charges, such as electrons and holes. In addition, the silicon germanide is as cost-effective as the silicon in terms of the process to effectively control the manufacturing cost of the semiconductor structure.

Step S102: Form, in the substrate, first trenches extending along a first direction and second trenches extending along a second direction, the first trenches and the second trenches separating the substrate into a plurality of spaced pillar structures, and the pillar structures each including the second semiconductor material layer, the silicon-germanium compound layer and a part of the first semiconductor material layer.

Referring to FIG. 7 to FIG. 18, there are a plurality of first trenches 14 and a plurality of second trenches 15. The first trenches 14 are spaced apart and extend along the first direction. The second trenches 15 are spaced apart and extend along the second direction. The first trenches 14 communicate with the second trenches 15. The first trenches 14 and the second trenches 15 separate the substrate 10 into a plurality of pillar structures 17. As shown by dotted lines in FIG. 15, the pillar structures 17 each include the second semiconductor material layer, the silicon-germanium compound layer, and a part of the first semiconductor material layer close to the silicon-germanium compound layer. The pillar structures 17 are provided with a gap therebetween. Exemplarily, the pillar structures 17 are arranged in an array.

It is to be noted that the first trenches 14 may be not as deep as the second trenches 15, for example, the first trenches 14 are deeper than the second trenches 15, and the first trenches 14 may be as wide as the second trenches 15. In the trench, the depth refers to a distance from the bottom to the top of the substrate 10, while the width refers to a distance between two opposite sidewalls. The first trenches 14 separate the substrate 10 under the pillar structures 17 into strip structures to form other structures such as BLs in the substrate 10.

Step S103: Dope the pillar structures, such that one of the first semiconductor material layer and the second semiconductor material layer forms a source region and the other forms a drain region, and the silicon-germanium compound layer forms a channel region.

Referring to FIG. 15 to FIG. 18, by means of doping, a source region and a drain region are formed separately at two sides of the silicon-germanium compound layer 12 in the pillar structure 17. In other words, by means of doping, one of the first semiconductor material layer 11 and the second semiconductor material layer 13 forms the source region, and the other forms the drain region. For example, the first semiconductor material layer 11 forms the drain region, and the second semiconductor material layer 13 forms the source region.

The doping may be implemented by ion plantation or thermal diffusion. Doping materials in the source region and the drain region may be of a same type. The silicon-germanium compound layer 12 forms a channel region. The conductive type (N type or P type) of the silicon-germanium compound layer 12 is different from that of the first semiconductor material layer 11. The conductive type of the first semiconductor material layer 11 is the same as that of the second semiconductor material layer 13.

Step S104: Form a dielectric layer on an outer peripheral surface of each of the pillar structures, and a gate on an outer peripheral surface of the dielectric layer, the gate being opposite to at least a part of the channel region.

Referring to FIG. 19 to FIG. 26, a dielectric layer 50 is formed on an outer peripheral surface of the pillar structure 17, namely on the pillar structure 17, the dielectric layer 50 surrounds and covers the first semiconductor material layer 11, the silicon-germanium compound layer 12 and the second semiconductor material layer 13. The dielectric layer 50 may be an oxide layer, such as silicon oxide, silicon oxynitride, tantalum oxide, aluminum oxide, hafnium oxide and hafnium silicon oxide. The thickness of the dielectric layer 50 may be determined according to actual needs.

A gate is formed on an outer peripheral surface of the dielectric layer 50 outside each of the pillar structures 17. The gate surrounds and covers the dielectric layer 50. The gate is opposite to at least a part of the channel region. The gate is provided between two adjacent channel regions. The top of the gate is higher than the bottom of the channel region, and the top of the channel region is higher than the bottom of the gate, namely the gate and the channel region at least partially overlap in the Z direction shown in FIG. 19. The gate may be made of metal such as tantalum, tungsten, tantalum nitride or titanium nitride. The gate may also be made of other conductive materials such as polycrystalline silicon.

In the embodiment of the present application, the source region, the drain region, the channel region, the dielectric layer 50 and the gate are formed into a VGAA transistor. Under the same area on the substrate, the channel region can be lengthened by heightening the pillar structure 17 to improve the short-channel effect of the transistor and the performance of the semiconductor structure.

In a possible embodiment of the present application, the step of forming a dielectric layer on an outer peripheral surface of each of the pillar structures, and a gate on an outer peripheral surface of the dielectric layer, the gate being opposite to at least a part of the channel region may include:

Step S1041: Form the dielectric layer on the outer peripheral surface of the pillar structure.

Specifically, the dielectric layer 50 is deposited on the outer peripheral surface and a top of the pillar structure 17 as well as on the first semiconductor material layer 11 and the first insulating layer 20 between the pillar structures 17. The dielectric layer 50 is then etched, and there remains the dielectric layer 50 on the outer peripheral surface of the pillar structure 17. As shown in FIG. 19 to FIG. 22, the remaining dielectric layer 50 surrounds and covers the outer peripheral surface of the pillar structure 17.

Step S1042: Form, on the first insulating layer and the first semiconductor material layer, a second insulating layer, a conductive layer and a third insulating layer that are stacked, the second insulating layer, the conductive layer and the third insulating layer being filled between the pillar structures upon formation of the dielectric layer.

Referring to FIG. 23 to FIG. 26, a second insulating layer 61 is deposited on the first insulating layer 20 and the first semiconductor material layer 11. A conductive layer 62 is deposited on the second insulating layer 61. A third insulating layer 63 is deposited on the conductive layer 62. The second insulating layer 61, the conductive layer 62 and the second insulating layer 61 are stacked sequentially. The second insulating layer 61, the conductive layer 62 and the second insulating layer 61 are filled between the pillar structures 17 upon formation of the dielectric layer 50.

The second insulating layer 61 may be opposite to the first semiconductor material layer 11 in the pillar structure 17. The conductive layer 62 may be opposite to the silicon-germanium compound layer 12 in the pillar structure 17. The conductive layer 62 is configured to subsequently form the gate. The second insulating layer 61 may be opposite to the second semiconductor material layer 13 in the pillar structure 17. The conductive layer 62 is electrically isolated by the second insulating layer 61 and the first insulating layer 20.

Exemplarily, a top of the third insulating layer 63 may be flush with a top of the second semiconductor material layer 13. For example, by depositing and etching back the third insulating layer 63, the third insulating layer and the second semiconductor material layer are formed into a flat surface. The second insulating layer 61 and the first insulating layer 20 may be made of a same material, and the second insulating layer 61 contacts the first insulating layer 20, such that the second insulating layer 61 and the first insulating layer 20 are formed into a whole. The third insulating layer 63 and the second insulating layer 61 may be made of a same material to facilitate the manufacture of the semiconductor structure.

Step S1043: Etch the third insulating layer and the conductive layer to form third trenches extending along the second direction, the third trenches being located between two adjacent rows of the pillar structures and exposing the second insulating layer, and the pillar structures in each row being arranged along the second direction.

Referring to FIG. 27 to FIG. 30, the third insulating layer 63 and the conductive layer 62 are etched along a direction perpendicular to the third insulating layer 63 to form third trenches 64. The third trenches 64 extend along the second direction, and are located between two adjacent rows of the pillar structures 17. The pillar structures 17 in each row are arranged along the second direction. There are gaps between the third trenches 64 and the pillar structures 17. It is to be understood that the pillar structures 17 form a plurality of pillar structure rows along the second direction, the third trenches 64 are located between two adjacent pillar structure rows, and the third trenches 64 are spaced apart from the pillar structures 17.

Figure 27:
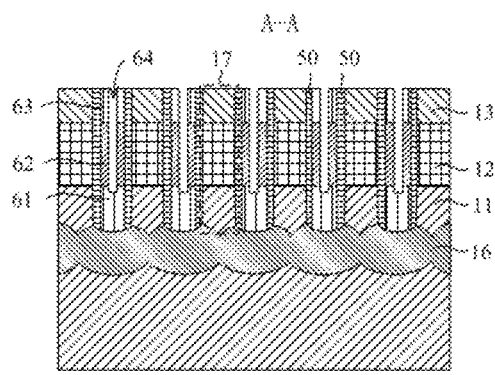
FIG. 27 to FIG. 30 are schematic sectional views at A-A, B-B, C-C and D-D after third trenches are formed according to an embodiment of the present application.
Figure 28:
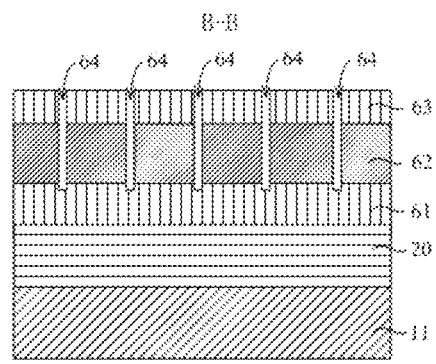
Figure 29:
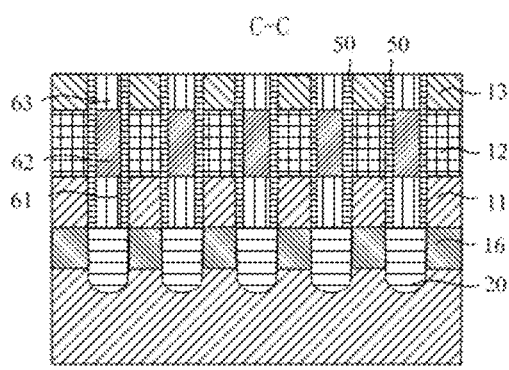
Figure 30:
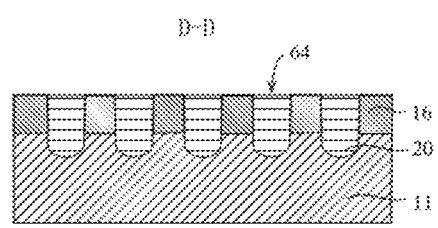

The third trenches 64 penetrate through the third insulating layer 63 and the conductive layer 62 to separate the conductive layer 62 into a plurality of members. The separated conductive layer 62 extends along the second direction. The second insulating layer 61 is exposed in the third trenches 64. In some possible examples, the third trenches 64 extend to the second insulating layer 61. As shown in FIG. 27 and FIG. 28, bottoms of the third trenches 64 are located in the second insulating layer 61. In other possible examples, the third trenches 64 are located on the second insulating layer 61, namely the third trenches 64 do not extend to the second insulating layer 61.

Step S1044: Form fourth insulating layers in the third trenches, the fourth insulating layers isolating the conductive layer into a plurality of WLs, and the WLs around the dielectric layers forming the gates.

Referring to FIG. 31 to FIG. 34, fourth insulating layers 65 are deposited in the third trenches 64. The fourth insulating layers 65 fill up the third trenches 64 to separate the conductive layer 62 into a plurality of WLs 66. Bottoms of the fourth insulating layers 65 contact the second insulating layer 61. Sides of the fourth insulating layers 65 close to the bottoms contact the second insulating layer 61, and sides of the fourth insulating layers 65 close to the tops contact the third insulating layer 63. The fourth insulating layer 65, the second insulating layer 61 and the third insulating layer 63 may be made of a same material such as silicon nitride, such that they are formed into a whole to electrically isolate the WLs 66.

Figure 31:
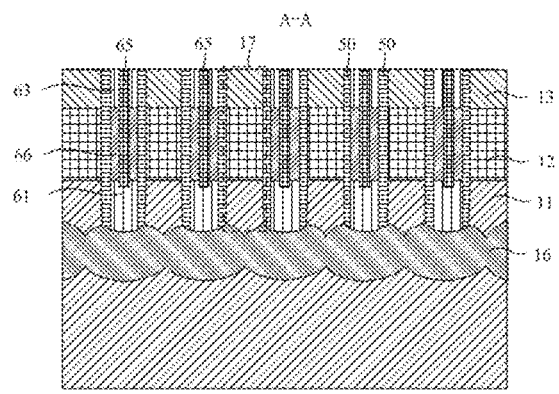
FIG. 31 to FIG. 34 are schematic sectional views at A-A, B-B, C-C and D-D after a fourth insulating layer is formed according to an embodiment of the present application.
Figure 32:
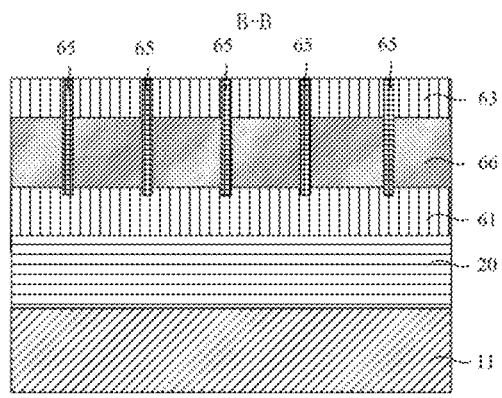
Figure 34:
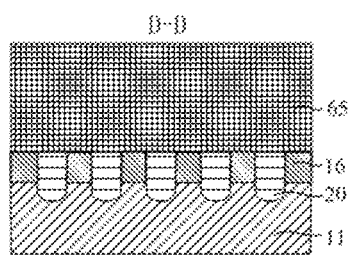
Figure 35:
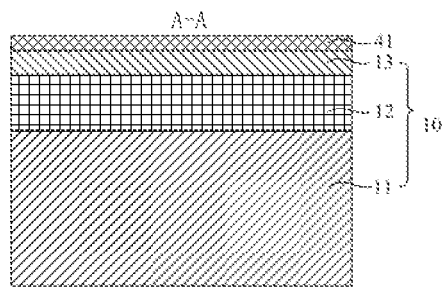
FIG. 35 to FIG. 38 are schematic sectional views at A-A, B-B, C-C and D-D after a first protective layer is formed according to an embodiment of the present application.
Figure 36:
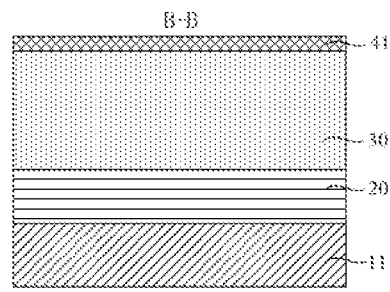
Figure 37:
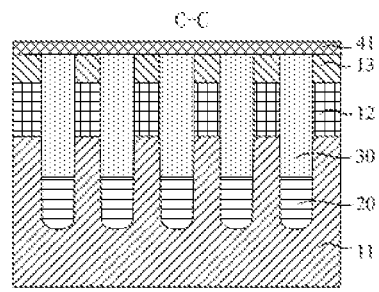
Figure 38:
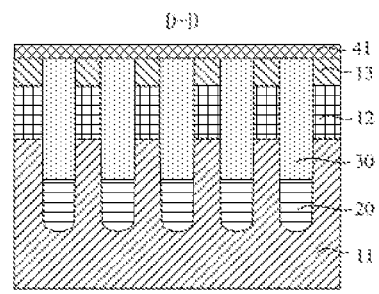
Figure 39:
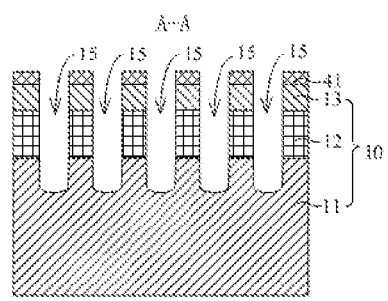
FIG. 39 to FIG. 42 are schematic sectional views at A-A, B-B, C-C and D-D after a part of a first protective layer is removed according to an embodiment of the present application.
Figure 40:
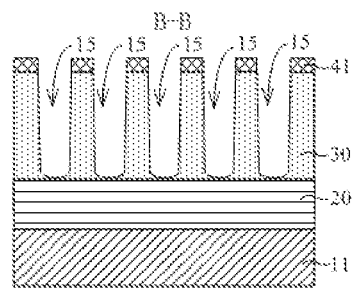
Figure 41:
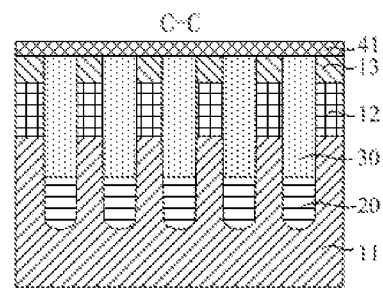
Figure 42:
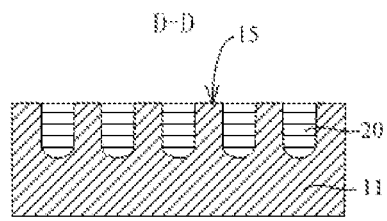
Figure 43:
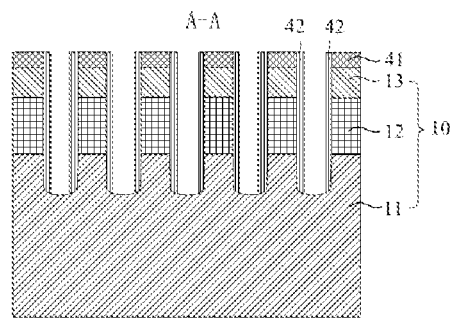
FIG. 43 to FIG. 46 are schematic sectional views at A-A, B-B, C-C and D-D after a second protective layer is formed according to an embodiment of the present application.
Figure 44:
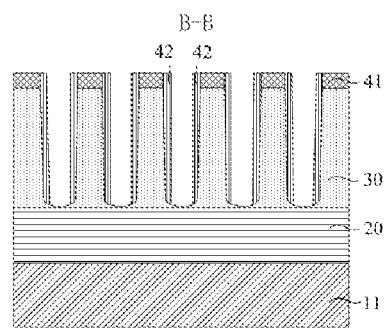
Figure 45:
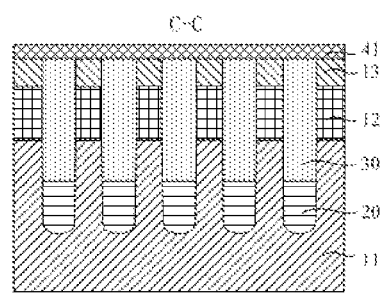
Figure 46:
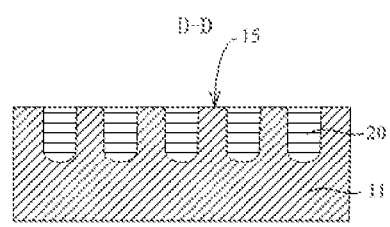
Figure 47:
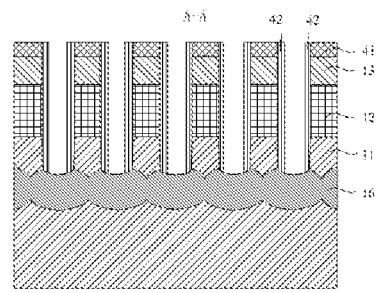
FIG. 47 to FIG. 50 are schematic sectional views at A-A, B-B, C-C and D-D after bit lines (BLs) are formed according to an embodiment of the present application.
Figure 48:
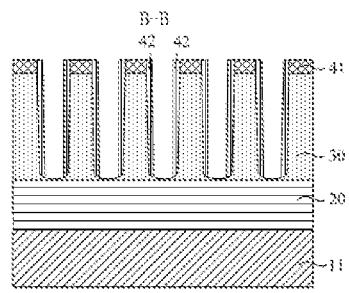
Figure 49:
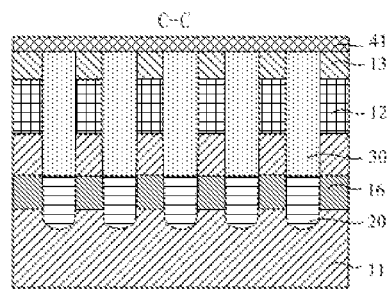
Figure 50:
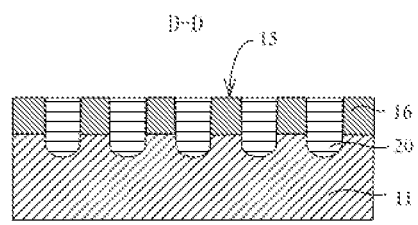
Figure 51:
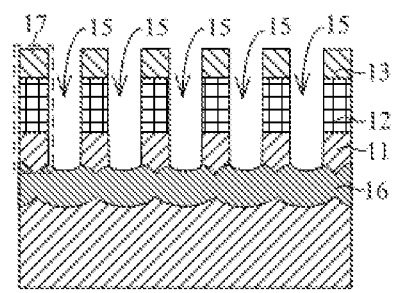
FIG. 51 to FIG. 54 are schematic sectional views at A-A, B-B, C-C and D-D after a sacrificial layer is removed according to an embodiment of the present application.
Figure 52:
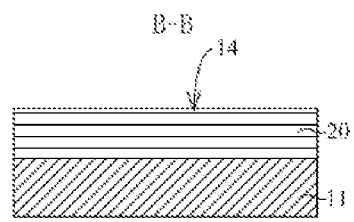
Figure 53:
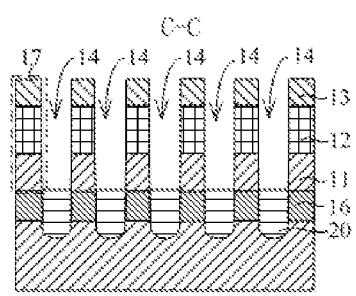
Figure 54:
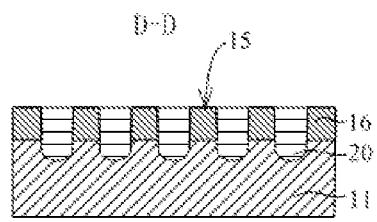

As shown in FIG. 31 and FIG. 34, the conductive layer 62 forms a plurality of WLs 66. Each WL 66 includes at least one gate. The WLs 66 around the dielectric layers 50 form the gates, namely the gates are constituted as one part of the WLs 66.

To sum up, according to the manufacturing method of a semiconductor structure provided by the embodiment of the present application, the pillar structures 17 each include the second semiconductor material layer 13, the silicon-germanium compound layer 12 and a part of the first semiconductor material layer 11. One of the first semiconductor material layer 11 and the second semiconductor material layer 13 forms the source region, and the other forms the drain region. The silicon-germanium compound layer 12 forms the channel region. The dielectric layer 50 is formed on the outer peripheral surface of each of the pillar structures 17. The gate is formed on the outer peripheral surface of the dielectric layer 50. The gate is opposite to at least a part of the channel region. That is, the source region, the drain region, the channel region, the dielectric layer 50 and the gate are formed into a VGAA transistor. Under the same area on the substrate, the channel region can be lengthened by heightening the pillar structure 17 to improve the short-channel effect of the transistor. Meanwhile, the VGAA transistor can implement all-around control on the channel region to improve the channel control capability, which further improves the short-channel effect of the transistor, reduces the working voltage and yields the better performance of the semiconductor structure. In addition, by forming the channel region with the silicon-germanium compound layer 12, the manufacturing method of a semiconductor structure can achieve a higher electron mobility in the channel region, reduce the saturation voltage of the VGAA transistor, and yield the better performance of the semiconductor structure.

In a possible embodiment of the present application, referring to FIG. 7 to FIG. 18, it is to be noted that the step of forming, in the substrate 10, first trenches 14 extending along a first direction and second trenches 15 extending along a second direction, the first trenches 14 and the second trenches 15 separating the substrate 10 into a plurality of spaced pillar structures 17, and the pillar structures 17 each including the second semiconductor material layer 13, the silicon-germanium compound layer 12 and a part of the first semiconductor material layer 11 includes:

Step S1021: Form, in the substrate, the first trenches extending along the first direction, the first trenches penetrating through the second semiconductor material layer and the silicon-germanium compound layer, and extending to the first semiconductor material layer.

Referring to FIG. 7 to FIG. 10, the substrate 10 is etched by wet etching or dry etching to form the first trenches 14 in the substrate 10. The first trenches 14 penetrate through the second semiconductor material layer 13 and the silicon-germanium compound layer 12, and extend to the first semiconductor material layer 11, namely bottoms of the first trenches 14 are located in the first semiconductor material layer 11.

Exemplarily, the first trenches 14 are formed by self-aligned double patterning (SADP) or self-aligned quadruple patterning (SAQP) to increase the density of the first trenches 14 and guarantee the aspect ratio of the first trenches 14.

Step S1022: Form, in the first trenches, a first insulating layer and a sacrificial layer that are stacked.

Referring to FIG. 11 to FIG. 14, a first insulating layer 20 is formed in the first trenches 14 by chemical vapor deposition (CVD), physical vapor deposition (PVD) or atomic layer deposition (ALD), and a sacrificial layer 30 is formed on the first insulating layer 20.

The first insulating layer 20 is filled in lower parts of the first trenches 14, while the sacrificial layer 30 is filled in upper parts of the first trenches 14. In a possible example, when the sacrificial layer 30 is deposited, the sacrificial layer 30 is filled in the first trenches 14 and covers the second semiconductor material layer 13. The sacrificial layer 30 on the second semiconductor material layer 13 is then removed by chemical mechanical polishing (CMP), such that the sacrificial layer 30 levels off the first trenches 14.

The first insulating layer 20 and the sacrificial layer 30 may be made of different materials. The sacrificial layer 30 has a larger etch selectivity than the first insulating layer 20, which makes the first insulating layer 20 less damaged in subsequent etching of the sacrificial layer 30. In addition, the first insulating layer 20 may further serve as an etch stop layer of the sacrificial layer 30. Exemplarily, the sacrificial layer 30 may be made of silicon oxide, while the first insulating layer 20 may be made of silicon oxynitride. Both the sacrificial layer 30 and the first insulating layer 20 have an etch selectivity of greater than or equal to 5.

As shown in FIG. 11 to FIG. 14, a top of the first insulating layer 20 is lower than a top of the first semiconductor material layer 11. In the first trench 14, the top refers to a surface away from the bottom, namely an upper surface shown in FIG. 11 to FIG. 14. The source region, the drain region and the channel region are subsequently formed in the substrate 10 higher than the first insulating layer 20. The first insulating layer 20 further isolates the substrate 10 between the first trenches 14.

Step S1023: Etch a part of the substrate and a part of the sacrificial layer to form the second trenches extending along the second direction, the second trenches exposing the first insulating layer.

Referring to FIG. 15 to FIG. 18, the substrate 10 and the sacrificial layer 30 are etched to remove a part of the substrate 10 and a part of the sacrificial layer 30, thereby forming the second trenches 15 in the substrate 10 and the sacrificial layer 30. In this case, the first insulating layer 20 may serve as the etch stop layer. For example, the second trenches 15 are formed by the SADP or the SAQP.

As shown in FIG. 15 to FIG. 18, the second trenches 15 penetrate through the second semiconductor material layer 13 and the silicon-germanium compound layer 12, and extend to the first semiconductor material layer 11. The second trenches 15 penetrate through the sacrificial layer 30, such that the second trenches 15 expose the first insulating layer 20. Bottoms of the second trenches 15 are located above the bottoms of the first trenches 14. The second trenches 15 further expose the first semiconductor material layer 11 in the substrate 10.

In some possible embodiments of the present application, referring to FIG. 35 to FIG. 38, it is to be noted that before the step of etching a part of the substrate 10 and a part of the sacrificial layer 30 to form the second trenches 15 extending along the second direction, the second trenches 15 exposing the first insulating layer 20, the manufacturing method of a semiconductor structure further includes: Form a first protective layer 41 on the second semiconductor material layer 13 and the sacrificial layer 30, the first protective layer 41 covering the second semiconductor material layer 13 and the sacrificial layer 30.

As shown in FIG. 35 to FIG. 38, a first protective layer 41 is deposited on the second semiconductor material layer 13 and the sacrificial layer 30, the first protective layer 41 covering the second semiconductor material layer 13 and the sacrificial layer 30. The first protective layer 41 and the sacrificial layer 30 may be made of a same material. In this case, the first protective layer 41 and the sacrificial layer 30 can be formed by deposition once to simplify the manufacture of the semiconductor structure.

Specifically, a sacrificial material is deposited in the first trenches 14. The sacrificial material fills up the first trenches 14. The sacrificial material in the first trenches 14 forms the sacrificial layer 30. After the sacrificial material fills up the first trenches 14, the sacrificial material is deposited continuously to cover the second semiconductor material layer 13 and the sacrificial layer 30. The sacrificial material on the second semiconductor material layer 13 and the sacrificial layer 30 forms the first protective layer 41. The first protective layer 41 may further be planarized to keep a top of the first protective layer 41 flush.

It is to be understood that when the first protective layer 41 and the sacrificial layer 30 are made of different materials, the sacrificial layer 30 may be formed in the first trenches 14 first and then the first protective layer 41 is deposited on the sacrificial layer 30 and the second semiconductor material layer 13.

Correspondingly, referring to FIG. 39 to FIG. 42, the step of etching a part of the substrate 10 and a part of the sacrificial layer 30 to form the second trenches 15 extending along the second direction, the second trenches 15 exposing the first insulating layer 20 includes: Etch the first protective layer 41, the part of the substrate 10 and the part of the sacrificial layer 30 to form the second trenches 15, and remain the first protective layer 41 between the second trenches 15.

Referring to FIG. 15 to FIG. 18, the first protective layer 41, the substrate 10 and the sacrificial layer 30 are etched along a direction perpendicular to the substrate 10 to form the second trenches 15. The second trenches 15 penetrate through the first protective layer 41. There remains the first protective layer 41 between adjacent second trenches 15, namely the first protective layer 41 covers the second semiconductor material layer 13 and the sacrificial layer 30 between adjacent second trenches 15. In some possible embodiments of the present application, referring to FIG. 43 to FIG. 54, it is to be noted that after the step of doping the pillar structures 17, such that one of the first semiconductor material layer 11 and the second semiconductor material layer 13 forms a source region and the other forms a drain region, and the silicon-germanium compound layer 12 forms a channel region, the manufacturing method of a semiconductor structure further includes:

Carry out a silicification reaction with the first semiconductor material layer 11 exposed in the second trenches 15 to form BLs 16 in the first semiconductor material layer 11 between adjacent ones of the first trenches 14, the BLs 16 each extending along the first direction, and being electrically connected to the source region or the drain region.

As shown in FIG. 47 to FIG. 50, parts of the bottoms of the second trenches 15 expose the first semiconductor material layer 11. With a silicification reaction on the first semiconductor material layer 11 in the second trenches 15, metal silicide is formed in the first semiconductor material layer 11. The metal silicide in adjacent second trenches 15 is connected to form the BLs 16 extending along the first direction. The metal silicide may be titanium silicide, tantalum silicide, cobalt silicide, nickel silicide or tungsten silicide.

Specifically, by depositing a metal layer in the second trenches 15 and annealing the metal layer, the metal in the metal layer reacts with the semiconductor material (such as silicon) in the first semiconductor material layer 11 to form the metal silicide. Thereafter, the excessive metal layer is removed. By generating the metal silicide through the silicification reaction, there is an ohmic contact between the BLs 16 and the first semiconductor material layer 11 to reduce the contact resistance therebetween.

Before the step of carrying out a silicification reaction with the first semiconductor material layer 11 exposed in the second trenches 15 to form BLs 16 in the first semiconductor material layer 11 between adjacent ones of the first trenches 14, the BLs 16 each extending along the first direction, the manufacturing method of a semiconductor structure further includes:

Form a second protective layer 42 on bottoms and sidewalls of the second trenches 15, on the second semiconductor material layer 13 and on the sacrificial layer 30. As shown in FIG. 43 to FIG. 46, the second protective layer 42 is formed by deposition. The second protective layer 42 covers the bottoms and sidewalls of the second trenches 15, the second semiconductor material layer 13 and the sacrificial layer 30.

Remove, upon formation of the second protective layer 42, the second protective layer 42 on the bottoms of the second trenches 15 to expose the first semiconductor material layer 11. The second protective layer 42 on the bottoms of the second trenches 15 is removed by anisotropic etching to expose the first semiconductor material layer 11 on the bottoms of the second trenches 15. There remains the second protective layer 42 on the sidewalls of the second trenches 15 to isolate and protect the sidewalls of the second trenches 15, for fear of the silicification reaction.

In other possible embodiments of the present application, as shown in FIG. 39 to FIG. 46, a first protective layer 41 is formed on the second semiconductor material layer 13 and the sacrificial layer 30. Correspondingly, a second protective layer 42 is formed on the bottoms and sidewalls of the second trenches 15 as well as on the first protective layer 41. The second protective layer 42 on the bottoms of the second trenches 15 is removed to expose the first semiconductor material layer 11.

When the second protective layer 42 on the bottoms of the second trenches 15 is removed by the anisotropic etching, the second protective layer 42 on the first protective layer 41 is removed therewith. In this case, the first protective layer 41 may still cover the second semiconductor material layer 13 and the sacrificial layer 30, so as not to expose the top of the second semiconductor material layer 13, thereby covering the whole sidewalls of the second trenches 15. During subsequent formation of the metal layer, the metal layer only contacts the first semiconductor material layer 11 on the bottoms of the second trenches 15 to simplify the forming process of the BLs 16.

After the step of carrying out a silicification reaction with the first semiconductor material layer 11 exposed in the second trenches 15 to form BLs 16 in the first semiconductor material layer 11 between adjacent ones of the first trenches 14, the BLs 16 each extending along the first direction, the manufacturing method of a semiconductor structure further includes: Remove the second protective layer 42 and the remaining sacrificial layer 30.

As shown in FIG. 47 to FIG. 54, upon formation of the BLs 16, the second protective layer 42 and the remaining sacrificial layer 30 are removed by etching. When there is the first protective layer 41, the first protective layer 41 is also removed by etching to expose the pillar structures 17 and facilitate the formation of the dielectric layers 50 and the like on the pillar structures 17. The second protective layer 42 and the sacrificial layer 30 are made of a same material. In this case, the second protective layer 42 and the sacrificial layer 30 can be removed by etching once to simplify the manufacture of the semiconductor structure.

Figure 55:
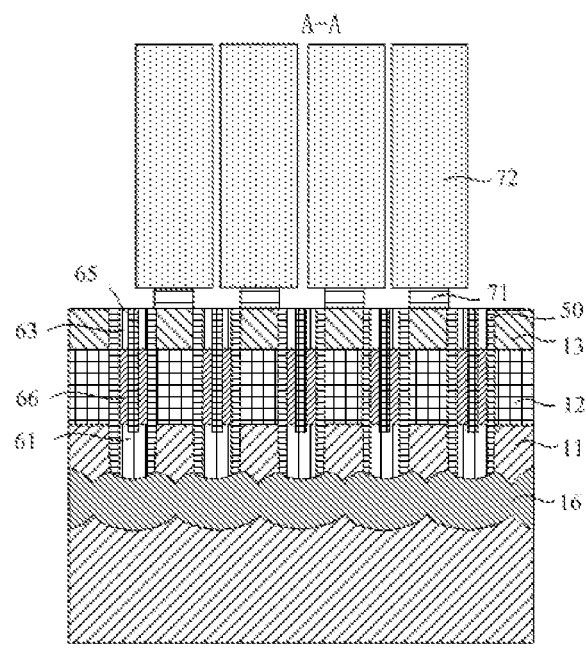
FIG. 55 to FIG. 56 are schematic sectional views at A-A, B-B, C-C and D-D after capacitors are formed according to an embodiment of the present application.
Figure 56:
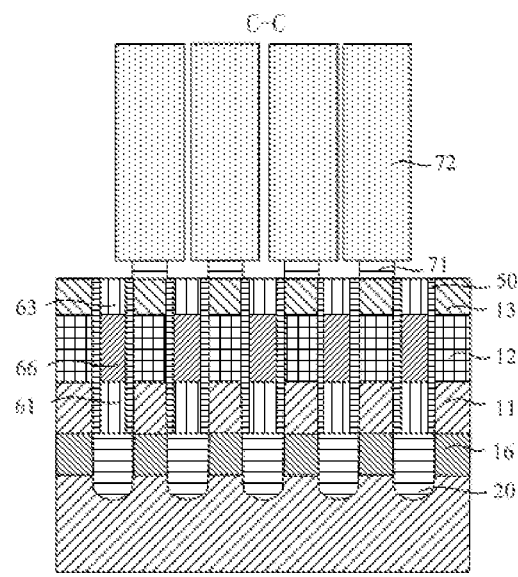

Referring to FIG. 55 and FIG. 56, upon formation of the gates 66, contact pads 71 and capacitors 72 electrically connected to the contact pads 71 are further formed on the substrate. The contact pads 71 are spaced apart, and electrically connected to the pillar structures 17 in one-to-one correspondence. In the embodiment of the present application, there are no limits made on the shape of the channel region. A recess may be formed in a part of the surface of the channel region. For example, a circumferentially surrounding recess is formed in an outer peripheral surface of the channel region to facilitate the manufacture. Specifically, referring to FIG. 57 to FIG. 65, after the step of etching a part of the substrate 10 and a part of the sacrificial layer 30 to form the second trenches 15 extending along the second direction, the second trenches 15 exposing the first insulating layer 20 (Step S1023), the manufacturing method of a semiconductor structure further includes: Deposit an intermediate layer 80 between the pillar structures 17, the intermediate layer 80 covering a surface of the first semiconductor material layer 11 of each of the pillar structures 17, and at least a part of a surface of the silicon-germanium compound layer 12 being exposed between the pillar structures 17 upon formation of the intermediate layer 80.

Figure 57:
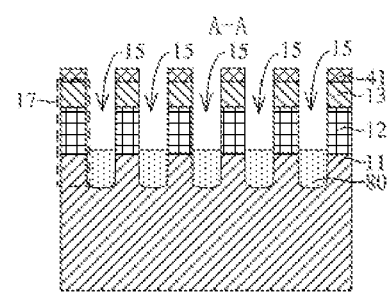
FIG. 57 is a schematic sectional view at A-A after an intermediate layer is formed according to an embodiment of the present application.

In a possible example, as shown in FIG. 57, an intermediate layer 80 is filled between the pillar structures 17. A top of the intermediate layer 80 is flush with a top of the first semiconductor material layer 11, or slightly higher than the top of the first semiconductor material layer 11. The top of the intermediate layer 80 is lower than a top of the silicon-germanium compound layer 12. The outer peripheral surface of the silicon-germanium compound layer 12 of each of the pillar structures 17 is nearly or completely exposed.

Figure 58:
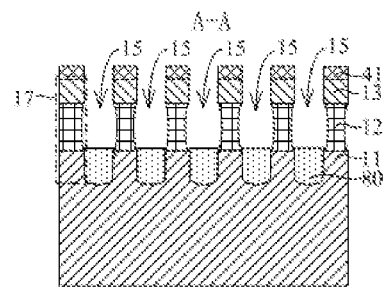
FIG. 58 is a schematic sectional view at A-A after a silicon-germanium compound layer is etched according to an embodiment of the present application.

Etch, upon formation of the intermediate layer 80, the surface of the silicon-germanium compound layer 12 exposed between the pillar structures 17, such that the silicon-germanium compound layer 12 forms a recessed region. As shown in FIG. 58, the exposed silicon-germanium compound layer 12 is etched. The silicon-germanium compound layer 12 not covered by the intermediate layer 80 forms a recess. The recess formed in the outer peripheral surface of the silicon-germanium compound layer 12 circumferentially surrounds the silicon-germanium compound layer 12.

Figure 59:
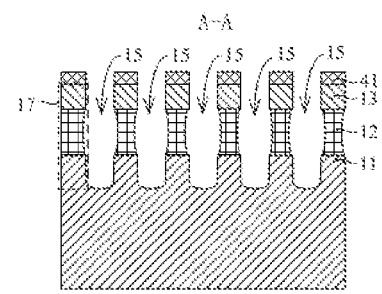
FIG. 59 is a schematic sectional view at A-A after an intermediate layer is removed according to an embodiment of the present application.

Remove the intermediate layer 80 upon formation of the recessed region. As shown in FIG. 59, upon removal of the intermediate layer 80, the first semiconductor material layer 11 is exposed for the subsequent manufacture.

Figure 60:
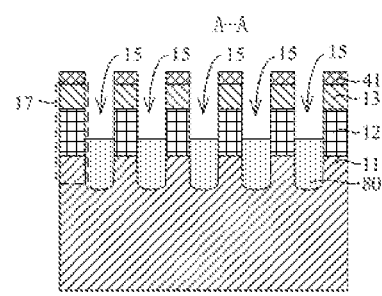
FIG. 60 is another schematic sectional view at A-A after an intermediate layer is formed according to an embodiment of the present application.
Figure 61:
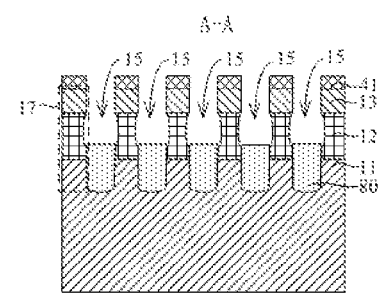
FIG. 61 is another schematic sectional view at A-A after a silicon-germanium compound layer is etched according to an embodiment of the present application.
Figure 62:
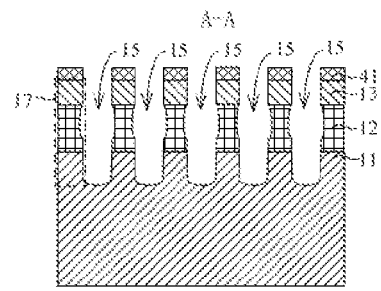
FIG. 62 is another schematic sectional view at A-A after an intermediate layer is removed according to an embodiment of the present application.

In a possible example, as shown in FIG. 60, an intermediate layer 80 is filled between the pillar structures 17. A top of the intermediate layer 80 is higher than a top of the first semiconductor material layer 11, and lower than a top of the silicon-germanium compound layer 12. The intermediate layer 80 is filled between the first semiconductor material layers 11 and between the silicon-germanium compound layers 12. The intermediate layer 80 covers a lower part of the silicon-germanium compound layer 12. An upper part of the silicon-germanium compound layer 12 is exposed. As shown in FIG. 61 and FIG. 62, a recess is formed in an outer peripheral surface of the upper part of the silicon-germanium compound layer 12. The recess circumferentially surrounds the silicon-germanium compound layer 12. The lower part of the silicon-germanium compound layer 12 is not etched.

Figure 63:
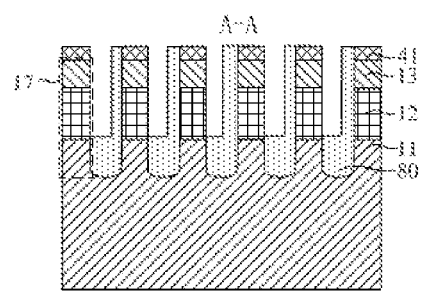
FIG. 63 is still another schematic sectional view at A-A after an intermediate layer is formed according to an embodiment of the present application.
Figure 64:
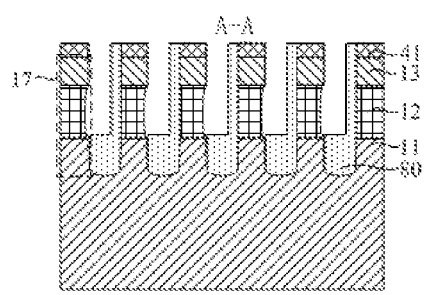
FIG. 64 is still another schematic sectional view at A-A after a silicon-germanium compound layer is etched according to an embodiment of the present application.
Figure 65:
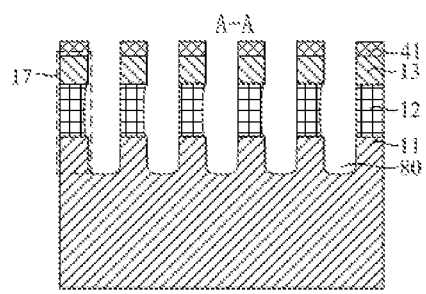
FIG. 65 is still another schematic sectional view at A-A after an intermediate layer is removed according to an embodiment of the present application.

In still another possible example, as shown in FIG. 63, an intermediate layer 80 is filled between the pillar structures 17. The intermediate layer 80 is filled between the first semiconductor material layers 11, and covers parts of outer peripheral surfaces of the pillar structures 17, namely a sidewall at one side of each of the silicon-germanium compound layers 12 and each of the second semiconductor material layers 13. As shown in FIG. 64, the intermediate layer 80 covers a surface of the first semiconductor material layer 11 and left surfaces of the pillar structures 17. Right surfaces of the pillar structures 17 are exposed. As shown in FIG. 65, a recess is formed in a part of an outer peripheral surface of the silicon-germanium compound layer 12. The recess does not circumferentially surround the silicon-germanium compound layer 12.

In the embodiment of the present application, the intermediate layer 80 may also be formed after other steps. For example, after the step of forming, in the first trenches 14, a first insulating layer 20 and a sacrificial layer 30 that are stacked (Step S1022), the intermediate layer 80 is formed in the first trenches 14, such that the recess is formed on a surface at one side of the channel region.

Figure 66:
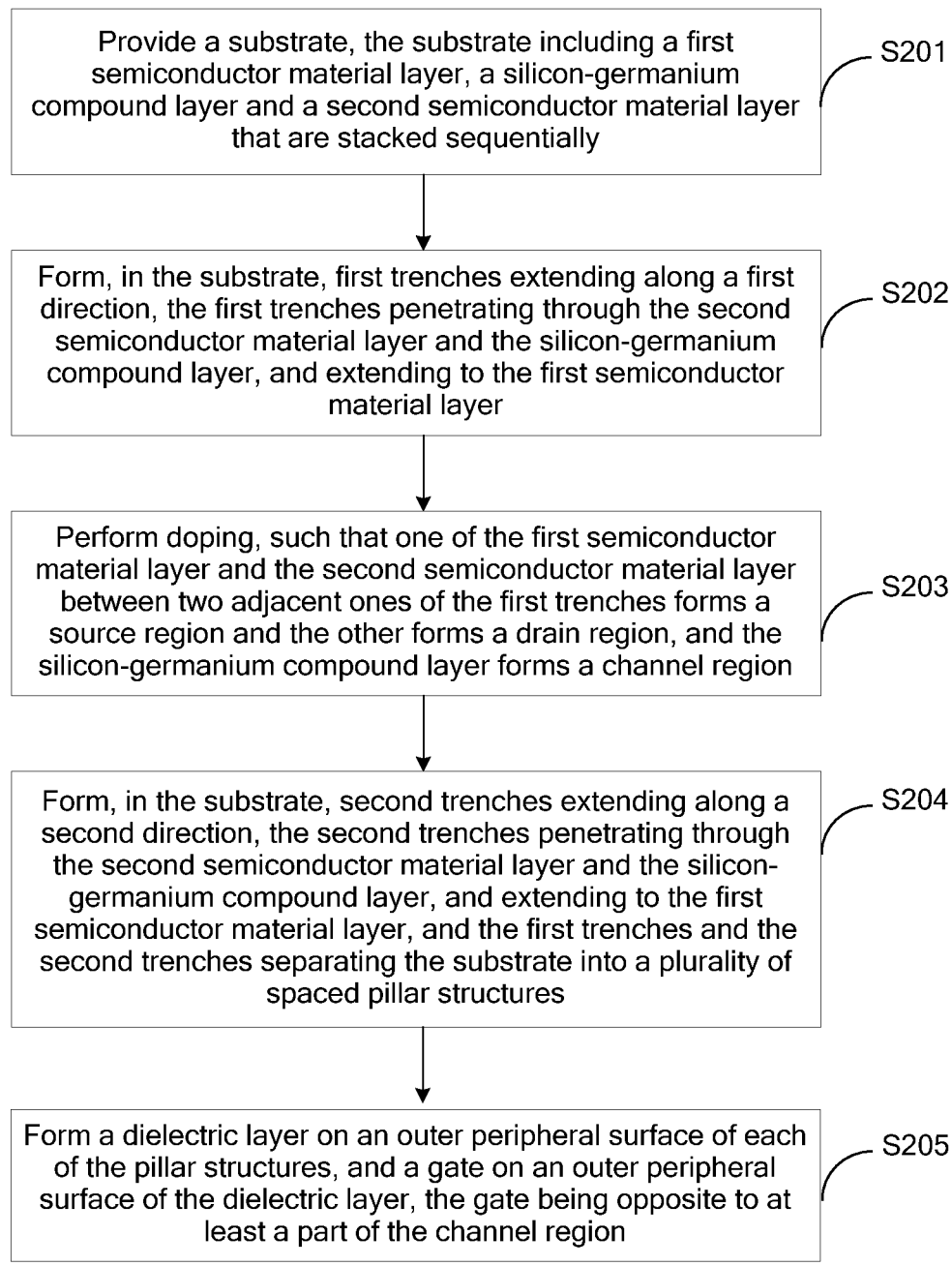
FIG. 66 is another flowchart of a manufacturing method of a semiconductor structure according to an embodiment of the present application.

Referring to FIG. 66, an embodiment of the present application further provides a manufacturing method of a semiconductor structure, including the following steps:

Step S201: Provide a substrate, the substrate including a first semiconductor material layer, a silicon-germanium compound layer and a second semiconductor material layer that are stacked sequentially.

Referring to FIG. 3 to FIG. 6, a substrate 10 includes a first semiconductor material layer 11, a silicon-germanium compound layer 12 and a second semiconductor material layer 13 that are arranged sequentially in the vertical direction (Z direction shown in FIG. 3). The first semiconductor material layer 11 and the second semiconductor material layer 13 may be made of a same material.

The silicon-germanium compound layer 12 may be made of silicon germanide, or a mixture containing the silicon germanide. For example, the first semiconductor material layer 11 and the second semiconductor material layer 13 are made of silicon, while the silicon-germanium compound layer 12 is made of silicon germanide. In this case, the silicon-germanium compound layer 12 may be formed on the first semiconductor material layer 11 by epitaxial growth. As a result, the current carriers in the substrate 10 have a higher mobility and the silicon germanide has a lower saturation voltage. In addition, the silicon germanide is as cost-effective as the silicon in terms of the process to effectively control the manufacturing cost of the semiconductor structure.

Step S202: Form, in the substrate, first trenches extending along a first direction, the first trenches penetrating through the second semiconductor material layer and the silicon-germanium compound layer, and extending to the first semiconductor material layer.

Referring to FIG. 7 to FIG. 10, the substrate 10 is etched by wet etching or dry etching. For example, first trenches 14 are formed in the substrate 10 by SADP or SAQP. The first trenches 14 extend along the first direction, penetrate through the second semiconductor material layer 13 and the silicon-germanium compound layer 12, and extend to the first semiconductor material layer 11, namely bottoms of the first trenches 14 are located in the first semiconductor material layer 11.

Step S203: Perform doping, such that one of the first semiconductor material layer and the second semiconductor material layer between two adjacent ones of the first trenches forms a source region and the other forms a drain region, and the silicon-germanium compound layer forms a channel region.

Structures between two adjacent first trenches 14 are doped by ion plantation or thermal diffusion, such that one of the first semiconductor material layer 11 and the second semiconductor material layer 13 forms a source region and the other forms a drain region, and the silicon-germanium compound layer 12 forms a channel region. The source region, the channel region and the drain region are stacked sequentially and extend along the first direction. A doped depth of the first semiconductor material layer 11 is less than a depth of the first trench 14, such that an upper part of the first semiconductor material layer 11 is doped, and a lower part of the first semiconductor material layer 11 is not doped. The lower part of the first semiconductor material layer 11 refers to a part of the first semiconductor material layer 11 close to the bottom of the first trench 14.

Step S204: Form, in the substrate, second trenches extending along a second direction, the second trenches penetrating through the second semiconductor material layer and the silicon-germanium compound layer, and extending to the first semiconductor material layer, and the first trenches and the second trenches separating the substrate into a plurality of spaced pillar structures.

As shown in FIG. 15 to FIG. 18, the second trenches 15 extend along a second direction, penetrate through the second semiconductor material layer 13 and the silicon-germanium compound layer 12, and extend to the first semiconductor material layer 11. Bottoms of the second trenches 15 are higher than the bottoms of the first trenches 14. The second trenches 15 and the first trenches 14 separate the doped substrate 10 into a plurality of spaced pillar structures 17. It is to be understood that the second trenches 15 separate the source region, the channel region and the drain region extending along the first direction, such that the pillar structures 17 are formed in the substrate 10.

In a possible embodiment, after the step of performing doping, such that one of the first semiconductor material layer 11 and the second semiconductor material layer 13 between two adjacent ones of the first trenches 14 forms a source region and the other forms a drain region, and the silicon-germanium compound layer 12 forms a channel region, the manufacturing method of a semiconductor structure further includes: Form, in the first trenches 14, a first insulating layer 20 and a sacrificial layer 30 that are stacked, a top of the first insulating layer 20 being lower than a top of the first semiconductor material layer 11.

As shown in FIG. 11 to FIG. 14, a first insulating layer 20 is formed in the first trenches 14 by CVD, PVD or ALD, and a sacrificial layer 30 is formed on the first insulating layer 20. The first insulating layer 20 is filled in lower parts of the first trenches 14, while the sacrificial layer 30 is filled in upper parts of the first trenches 14. A top of the first insulating layer 20 is lower than a top of the first semiconductor material layer 11. The top refers to an upper surface shown in FIG. 11 to FIG. 14.

The first insulating layer 20 and the sacrificial layer 30 may be made of different materials. The sacrificial layer 30 has a larger etch selectivity than the first insulating layer 20, such that the first insulating layer 20 may serve as an etch stop layer when the second trenches 15 are formed subsequently. Exemplarily, the sacrificial layer 30 may be made of silicon oxide, while the first insulating layer 20 may be made of silicon oxynitride.

Correspondingly, the substrate 10 and the sacrificial layer 30 are etched to form the second trenches 15. For example, the second trenches 15 are formed by the SADP or the SAQP.

Step S205: Form a dielectric layer on an outer peripheral surface of each of the pillar structures, and a gate on an outer peripheral surface of the dielectric layer, the gate being opposite to at least a part of the channel region.

Referring to FIG. 19 to FIG. 22, a dielectric layer 50 is formed on an outer peripheral surface of the pillar structure 17, namely on the pillar structure 17, the dielectric layer 50 surrounds and covers the first semiconductor material layer 11, the silicon-germanium compound layer 12 and the second semiconductor material layer 13. The dielectric layer 50 may be an oxide layer, such as silicon oxide, silicon oxynitride, tantalum oxide, aluminum oxide, hafnium oxide and hafnium silicon oxide. The thickness of the dielectric layer 50 may be determined according to actual needs.

A gate is formed on an outer peripheral surface of the dielectric layer 50 outside each of the pillar structures 17. The gate surrounds and covers the dielectric layer 50. The gate is opposite to at least a part of the channel region. As shown in FIG. 22 to FIG. 25, the gate is formed between two adjacent channel regions. The top of the gate is higher than the bottom of the channel region, and the top of the channel region is higher than the bottom of the gate, namely the gate and the channel region at least partially overlap in the Z direction. The gate may be made of metal such as tantalum, tungsten, tantalum nitride or titanium nitride. The gate may also be made of other conductive materials such as polycrystalline silicon.

Other processes in the embodiments may refer to those described in the foregoing embodiment, and will not be repeated herein.

According to the manufacturing method of a semiconductor structure provided by the embodiment of the present application, the first trenches 14 extending along the first direction are formed in the substrate 10. The doping is performed, such that one of the first semiconductor material layer 11 and the second semiconductor material layer 13 between two adjacent ones of the first trenches 14 forms the source region and the other forms the drain region, and the silicon-germanium compound layer 12 forms the channel region. The second trenches 15 extending along the second direction are formed in the substrate 10, the first trenches 14 and the second trenches 15 separating the substrate 10 into a plurality of spaced pillar structures 17. The dielectric layer 50 is formed on the outer peripheral surface of each of the pillar structures 17 and the gate is formed on the outer peripheral surface of the dielectric layer 50, the gate being opposite to at least a part of the channel region. That is, the source region, the drain region, the channel region, the dielectric layer 50 and the gate are formed into a VGAA transistor. Under the same area on the substrate, the channel region can be lengthened by heightening the pillar structure 17 to improve the short-channel effect of the transistor. Meanwhile, the VGAA transistor can implement all-around control on the channel region to improve the channel control capability, which further improves the short-channel effect of the transistor, reduces the working voltage and yields the better performance of the semiconductor structure. In addition, by forming the channel region with the silicon-germanium compound layer 12, the manufacturing method of a semiconductor structure can achieve a higher electron mobility in the channel region, reduce the saturation voltage of the VGAA transistor, and yield the better performance of the semiconductor structure.

Figure 33:
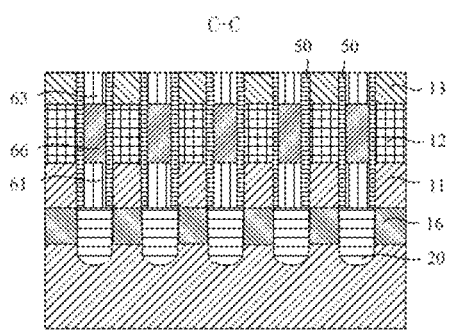

An embodiment of the present application further provides a semiconductor structure. Referring to FIG. 33 to FIG. 34, the semiconductor structure includes a substrate 10 (referring to FIG. 3). A plurality of spaced BLs 16 are formed in the substrate 10. The BLs 16 extend along a first direction. A first insulating layer 20 is provided between adjacent BLs 16. Adjacent BLs 16 are electrically isolated by the first insulating layer 20. Exemplarily, the first insulating layer 20 is filled between adjacent BLs 16. A top of the first insulating layer 20 is flush with tops of the BLs 16.

A plurality of spaced pillar structures 17 are further formed in the substrate 10. The BLs 16 each are provided thereon with at least one of the pillar structures 17. The pillar structures 17 each include a source region, a channel region and a drain region that are stacked sequentially. The source region or the drain region in the pillar structure 17 is electrically connected to the BL 16. For example, the source region or the drain region in the pillar structure 17 contacts the BL 16. A material of the source region may be the same as that of the drain region and different from that of the channel region. The material of the channel region includes a silicon-germanium compound such as silicon germanide to improve the mobility of the current carriers and reduce the saturation voltage.

A dielectric layer 50 is circumferentially provided on an outer peripheral surface of each of the pillar structures 17. The dielectric layer 50 surrounds and covers the source region, the channel region and the drain region. The dielectric layer 50 may be an oxide layer, such as silicon oxide, silicon oxynitride, tantalum oxide, aluminum oxide, hafnium oxide and hafnium silicon oxide.

A gate is formed on an outer peripheral surface of the dielectric layer 50. The gate surrounds and covers the dielectric layer 50. The gate is opposite to at least a part of the channel region. Specifically, the top of the gate is higher than the bottom of the channel region, and the top of the channel region is higher than the bottom of the gate, namely the gate and the channel region at least partially overlap in the Z direction shown in the figures. The gate may be made of a conductive material such as tantalum, tungsten, tantalum nitride, titanium nitride or polycrystalline silicon.

The source region, the drain region, the channel region, the dielectric layer 50 and the gate are formed into a VGAA transistor. Under the same area on the substrate, the channel region can be lengthened by heightening the pillar structure to improve the short-channel effect of the transistor. Meanwhile, the VGAA transistor can implement all-around control on the channel region to improve the channel control capability, which further improves the short-channel effect of the transistor, reduces the working voltage and yields the better performance of the semiconductor structure. In the embodiment of the present application, there are no limits made on the shape of the channel region. A recess may further be formed in an outer peripheral surface of the channel region. Exemplarily, the recess may form an annular groove circumferentially surrounding the channel region.

A second insulating layer 61, a third insulating layer 63 and fourth insulating layers 65 are filled between outer peripheral surfaces of adjacent ones of the dielectric layers 50. The third insulating layer 63 is located on the gates to cover the gates. The fourth insulating layers 65 are located between two adjacent rows of the gates, and opposite to the gates and the third insulating layer 63. The gates in each row are arranged along a second direction. The second insulating layer 61 is located under the fourth insulating layers 65 and the gates.

Two adjacent rows of the gates are electrically isolated by the second insulating layer 61, the third insulating layer 63 and the fourth insulating layers 65. The second insulating layer 61, the third insulating layer 63 and the fourth insulating layers 65 may be made of a same material to form a whole. Each row of the gates are electrically connected to form WLs 66 extending along the second direction, namely the WLs 66 around the dielectric layers 50 form the gates.

According to the semiconductor structure provided by the embodiment of the present application, the source region, the channel region and the drain region are stacked sequentially, the dielectric layer 50 is circumferentially provided on outer peripheral surfaces of the source region, the channel region and the drain region, the gate is circumferentially provided on the outer peripheral surface of the dielectric layer 50, and the gate is opposite to at least a part of the channel region, thereby forming a VGAA transistor. The length of the channel region is adjusted easily to improve the short-channel effect of the transistor. Meanwhile, the VGAA transistor can implement all-around control on the channel region to improve the channel control capability, which further improves the short-channel effect of the transistor, reduces the working voltage and yields the better performance of the semiconductor structure. In addition, as the material of the channel region includes the silicon-germanium compound, the semiconductor structure can achieve a higher electron mobility in the channel region, reduce the saturation voltage of the VGAA transistor, and yield the better performance of the semiconductor structure.

The embodiments or implementations of this specification are described in a progressive manner, and each embodiment focuses on differences from other embodiments. The same or similar parts between the embodiments may refer to each other. In the descriptions of this specification, a description with reference to the term "one implementation", "some implementations", "an exemplary implementation", "an example", "a specific example", "some examples", or the like means that a specific feature, structure, material, or characteristic described in combination with the implementation(s) or example(s) is included in at least one implementation or example of the present application. In this specification, the schematic expression of the above terms does not necessarily refer to the same embodiment or example. Moreover, the described specific feature, structure, material or characteristic may be combined in an appropriate manner in any one or more embodiments or examples.

Finally, it should be noted that the above embodiments are merely used to explain the technical solutions of the present application, but are not intended to limit the present application. Although the present application is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the scope of the technical solutions of the embodiments of the present application.

The invention claimed is:

1. A manufacturing method of a semiconductor structure, comprising:
    providing a substrate, the substrate comprising a first semiconductor material layer, a silicon-germanium compound layer and a second semiconductor material layer that are stacked sequentially;
    forming, in the substrate, first trenches extending along a first direction and second trenches extending along a second direction, the first trenches and the second trenches separating the substrate into a plurality of spaced pillar structures, and the pillar structures each comprising the second semiconductor material layer, the silicon-germanium compound layer and a part of the first semiconductor material layer;
    doping the pillar structures, such that one of the first semiconductor material layer and the second semiconductor material layer forms a source region and the other of the first semiconductor material layer and the second semiconductor material layer forms a drain region, and the silicon-germanium compound layer forms a channel region; and
    forming a dielectric layer on an outer peripheral surface of each of the pillar structures, and a gate on an outer peripheral surface of the dielectric layer, the gate being opposite to at least a part of the channel region;
    wherein the forming, in the substrate, first trenches extending along a first direction and second trenches extending along a second direction, the first trenches and the second trenches separating the substrate into a plurality of spaced pillar structures, and the pillar structures each comprising the second semiconductor material layer, the silicon-germanium compound layer and a part of the first semiconductor material layer comprises:
    forming, in the substrate, the first trenches extending along the first direction, the first trenches penetrating through the second semiconductor material layer and the silicon-germanium compound layer, and extending to the first semiconductor material layer;
    forming, in the first trenches, a first insulating layer and a sacrificial layer that are stacked; and
    etching a part of the substrate and a part of the sacrificial layer to form the second trenches extending along the second direction, the second trenches exposing the first insulating layer;
    wherein a top of the first insulating layer is lower than a top of the first semiconductor material layer.

2. The manufacturing method of a semiconductor structure according to claim 1, before the etching a part of the substrate and a part of the sacrificial layer to form the second trenches extending along the second direction, the second trenches exposing the first insulating layer, the manufacturing method further comprises:
    forming a first protective layer on the second semiconductor material layer and the sacrificial layer, the first protective layer covering the second semiconductor material layer and the sacrificial layer; and
    the etching a part of the substrate and a part of the sacrificial layer to form the second trenches extending along the second direction, the second trenches exposing the first insulating layer comprises: etching the first protective layer, the part of the substrate and the part of the sacrificial layer to form the second trenches, and the first protective layer located between the second trenches is retained.

3. The manufacturing method of a semiconductor structure according to claim 1, after the doping the pillar structures, such that one of the first semiconductor material layer and the second semiconductor material layer forms a source region and the other of the first semiconductor material layer and the second semiconductor material layer forms a drain region, and the silicon-germanium compound layer forms a channel region, the manufacturing method further comprises:

carrying out a silicification reaction with the first semiconductor material layer exposed in the second trenches to form bit lines (BLs) in the first semiconductor material layer between adjacent ones of the first trenches, the BLs each extending along the first direction, and being electrically connected to the source region or the drain region.

4. The manufacturing method of a semiconductor structure according to claim 3, before the carrying out a silicification reaction with the first semiconductor material layer exposed in the second trenches to form BLs in the first semiconductor material layer between adjacent ones of the first trenches, the BLs each extending along the first direction, the manufacturing method further comprises:

forming a second protective layer on bottoms and sidewalls of the second trenches, on the second semiconductor material layer and on the sacrificial layer; and removing the second protective layer on the bottoms of the second trenches to expose the first semiconductor material layer.

5. The manufacturing method of a semiconductor structure according to claim 4, after the carrying out a silicification reaction with the first semiconductor material layer exposed in the second trenches to form BLs in the first semiconductor material layer between adjacent ones of the first trenches, the BLs each extending along the first direction, the manufacturing method further comprises:

removing the second protective layer and the remaining sacrificial layer.

6. The manufacturing method of a semiconductor structure according to claim 1, wherein the forming a dielectric layer on an outer peripheral surface of each of the pillar structures, and a gate on an outer peripheral surface of the dielectric layer, the gate being opposite to at least a part of the channel region comprises:

forming the dielectric layer on the outer peripheral surface of the pillar structure;

forming, on the first insulating layer and the first semiconductor material layer, a second insulating layer, a conductive layer and a third insulating layer that are stacked, the second insulating layer, the conductive layer and the third insulating layer being filled between the pillar structures after the dielectric layer is formed;

etching the third insulating layer and the conductive layer to form third trenches extending along the second direction, the third trenches being located between two adjacent rows of the pillar structures and exposing the second insulating layer, and the pillar structures in each row being arranged along the second direction; and forming fourth insulating layers in the third trenches, the fourth insulating layers isolating the conductive layer into a plurality of word lines (WLs), and the WLs around the dielectric layers forming the gates.

7. The manufacturing method of a semiconductor structure according to claim 6, wherein the third trenches further extend to the second insulating layer, or the third trenches are located on the second insulating layer.

8. The manufacturing method of a semiconductor structure according to claim 6, wherein the forming the dielectric layer on the outer peripheral surface of the pillar structure comprises:

depositing the dielectric layer on the outer peripheral surface and a top of the pillar structure as well as on the first semiconductor material layer and the first insulating layer between the pillar structures; and etching the dielectric layer, and remaining the dielectric layer on the outer peripheral surface of the pillar structure.

9. The manufacturing method of a semiconductor structure according to claim 1, after the etching a part of the substrate and a part of the sacrificial layer to form the second trenches extending along the second direction, the second trenches exposing the first insulating layer, the manufacturing method further comprises:

depositing an intermediate layer between the pillar structures, the intermediate layer covering a surface of the first semiconductor material layer of each of the pillar structures, and at least a part of a surface of the silicon-germanium compound layer being exposed between the pillar structures after the intermediate layer is formed;

etching the surface of the silicon-germanium compound layer exposed between the pillar structures, such that the silicon-germanium compound layer forms a recessed region; and removing the intermediate layer.

10. The manufacturing method of a semiconductor structure according to claim 9, wherein a top of the intermediate layer is higher than a top of the first semiconductor material layer, and lower than a top of the silicon-germanium compound layer; or the intermediate layer is filled between the first semiconductor material layers, and covers a sidewall at one side of each of the silicon-germanium compound layers and each of the second semiconductor material layers.

\* \* \* \* \*